United States Patent
Gurgi et al.

(10) Patent No.: US 10,115,476 B2
(45) Date of Patent: Oct. 30, 2018

(54) ADVANCED PROGRAMMING VERIFICATION SCHEMES FOR MEMORY CELLS

(71) Applicant: Apple Inc., Cupertino, CA (US)

(72) Inventors: Eyal Gurgi, Petah-Tikva (IL); Yoav Kasorla, Kfar Netar (IL); Barak Rotbard, Tel-Aviv (IL); Shai Ojalvo, Moshav Olesh (IL)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/221,947

(22) Filed: Jul. 28, 2016

(65) Prior Publication Data

US 2016/0336078 A1    Nov. 17, 2016

Related U.S. Application Data

(63) Continuation of application No. 14/662,470, filed on Mar. 19, 2015, now Pat. No. 9,417,948, which is a
(Continued)

(51) Int. Cl.
*G06F 11/07* (2006.01)
*G06F 11/263* (2006.01)
(Continued)

(52) U.S. Cl.
CPC .............. *G11C 29/38* (2013.01); *G06F 11/07* (2013.01); *G06F 11/073* (2013.01);
(Continued)

(58) Field of Classification Search
CPC ... G11C 29/52; G11C 16/349; G11C 11/5628; G06F 11/1068; G06F 3/064; G06F 2212/7211
(Continued)

(56) References Cited

U.S. PATENT DOCUMENTS 6,928,001 B2    8/2005   Avni et al.
7,355,892 B2    4/2008   Hemink
(Continued)

FOREIGN PATENT DOCUMENTS

JP    H0991979    4/1997
JP    H1050083    2/1998
(Continued)

OTHER PUBLICATIONS

KIPO's Notice of Preliminary Rejection (English Translation) in Korean Patent Application No. 10-2014-7023284 dated Sep. 23, 2015.
(Continued)

*Primary Examiner* — James C Kerveros
(74) *Attorney, Agent, or Firm* — Meyertons, Hood, Kivlin, Kowert & Goetzel, P.C.

(57) ABSTRACT

A method for data storage includes receiving in a memory device data for storage in a group of memory cells. The data is stored in the group by performing a Program and Verify (P&V) process, which applies to the memory cells in the group a sequence of programming pulses and compares respective analog values of the memory cells in the group to respective verification thresholds. Immediately following successful completion of the P&V process, a mismatch between the stored data and the received data is detected in the memory device. An error in storage of the data is reported responsively to the mismatch.

20 Claims, 3 Drawing Sheets

Related U.S. Application Data continuation of application No. 13/356,694, filed on Jan. 24, 2012, now Pat. No. 9,009,547.

(60) Provisional application No. 61/436,619, filed on Jan. 27, 2011, provisional application No. 61/486,341, filed on May 16, 2011.

(51) Int. Cl.
| | |
|---|---|
| *G11C 11/16* | (2006.01) |
| *G11C 11/56* | (2006.01) |
| *G11C 13/00* | (2006.01) |
| *G11C 16/10* | (2006.01) |
| *G11C 16/34* | (2006.01) |
| *G11C 29/12* | (2006.01) |
| *G11C 29/38* | (2006.01) |
| *G11C 29/44* | (2006.01) |
| *G11C 29/50* | (2006.01) |

(52) U.S. Cl.
CPC ........ *G06F 11/0772* (2013.01); *G06F 11/263* (2013.01); *G11C 11/1677* (2013.01); *G11C 11/5628* (2013.01); *G11C 11/5635* (2013.01); *G11C 11/5678* (2013.01); *G11C 13/0035* (2013.01); *G11C 13/0064* (2013.01); *G11C 13/0069* (2013.01); *G11C 13/0097* (2013.01); *G11C 16/10* (2013.01); *G11C 16/3459* (2013.01); *G11C 29/12015* (2013.01); *G11C 29/44* (2013.01); *G11C 29/50012* (2013.01)

(58) Field of Classification Search
USPC .......................................................... 714/763
See application file for complete search history.

(56) References Cited

U.S. PATENT DOCUMENTS

| | | | |
|---|---|---|---|
| 7,415,646 B1 | 8/2008 | Lee et al. | |
| 7,656,710 B1 | 2/2010 | Wong | |
| 7,889,562 B2 * | 2/2011 | Nobunaga | G11C 16/10 365/185.18 |
| 8,059,464 B2 * | 11/2011 | Kwak | G11C 11/5628 365/185.03 |
| 8,085,586 B2 | 12/2011 | Golov | |
| 8,228,734 B2 | 7/2012 | Wang | |
| 8,250,417 B2 * | 8/2012 | Feeley | G06F 11/1068 714/718 |
| 8,351,267 B2 | 1/2013 | Baik et al. | |
| 8,391,068 B2 * | 3/2013 | Shelton | G11C 16/16 365/185.18 |
| 8,479,061 B2 * | 7/2013 | Sartore | G06F 11/327 365/185.3 |
| 2001/0040826 A1 | 11/2001 | Lakhani | |
| 2004/0114437 A1 | 6/2004 | Li | |
| 2006/0158940 A1 | 7/2006 | Shappir | |
| 2008/0181001 A1 | 7/2008 | Shalvi | |
| 2008/0239828 A1 | 10/2008 | Lee | |
| 2008/0279005 A1 | 11/2008 | France | |
| 2009/0043951 A1 | 2/2009 | Shalvi | |
| 2010/0027336 A1 * | 2/2010 | Park | G11C 11/5628 365/185.09 |
| 2010/0050053 A1 * | 2/2010 | Wilson | G06F 11/1068 714/773 |
| 2010/0077132 A1 | 3/2010 | Hung | |
| 2010/0135082 A1 | 6/2010 | Bathul | |
| 2010/0199150 A1 | 8/2010 | Shalvi | |
| 2010/0306582 A1 | 12/2010 | Han et al. | |
| 2010/0315876 A1 | 12/2010 | Park | |
| 2011/0044102 A1 | 2/2011 | Dong | |
| 2011/0063904 A1 | 3/2011 | Chang | |
| 2012/0014179 A1 | 1/2012 | Choy et al. | |
| 2015/0193293 A1 | 7/2015 | Gurgi | |

FOREIGN PATENT DOCUMENTS

| | | |
|---|---|---|
| JP | H10199263 | 7/1998 |
| JP | 2001093287 | 4/2001 |
| JP | 2004110986 | 4/2004 |
| JP | 2008293635 | 12/2008 |
| JP | 2010027165 | 2/2010 |
| JP | 2011008913 | 1/2011 |
| WO | 2008011440 | 1/2008 |
| WO | 2012030692 | 3/2012 |

OTHER PUBLICATIONS

Office Action in Japanese Patent Application No. 2014-554739 dated Mar. 14, 2016.
Office Action in Chinese Patent Application No. 201380006438.4 dated Mar. 23, 2016.
Office Action in European Patent Application 13152130.4 dated Mar. 10, 2016.
Office Action, Japanese Application No. 2014554739, dated Jul. 13, 2015, 8 pages.
International Preliminary Report on Patentability for PCT/US2013/021694 dated Aug. 7, 2014.
International Preliminary Report on Patentability for PCT/US2013/021756 dated Aug. 7, 2014.
Notice of Allowance from Korean Application No. 10-2013-7894 dated Jun. 9, 2014.
Notice of Allowance from Japanese Application No. 2013024933 dated Mar. 27, 2014.
Extended European Search Report for Application No. 13152130.4 dated Sep. 24, 2013.
International Search Report and Written Opinion in Application No. OCT.YS2013/021756 dated Jul. 31, 2013.
Invitation to Pay Additional Fees and Partial Search Report in Application No. PCT/US2013/021756 dated Jun. 5, 2013.
International Search Report and Written Opinion in Application No. PCT/US2013/21694 dated Apr. 16, 2013.
Office action and search report in ROC (Taiwan) Pat. Appln. No. 102102522 dated Mar. 12, 2015.
Office action and search report in ROC (Taiwan) Pat. Appln. No. 102102523 dated Mar. 12, 2015.
Office action in European application No. 13 701 345.5-1805 dated Apr. 13, 2017.
Summons to Attend Oral Proceedings in EP Application No. 13152130.4 dated Jan. 2, 2018, 9 pages.
Office Action from Japanese Patent Application No. 2013-24933, dated Dec. 25, 2013, (English and Japanese Versions), pp. 1-5.
Notice of Preliminary Rejection from Korean Patent Application No. 10-2013-0007894, dated Dec. 19, 2013, English and Korean versions, pp. 1-9.
Office Action in EP Appl. No. 13701345.4 dated Mar. 27, 2018, 6 pages.

* cited by examiner

ADVANCED PROGRAMMING VERIFICATION SCHEMES FOR MEMORY CELLS

CROSS-REFERENCE TO RELATED APPLICATIONS

This application is a continuation application of U.S. patent application Ser. No. 14/662,470, entitled "Advanced Programming Verification Schemes for Analog Memory Cells" which was filed Mar. 19, 2015, which is a continuation application of U.S. patent application Ser. No. 13/356,694, entitled "Advanced Programming Verification Schemes for Analog Memory Cells" which was filed Jan. 24, 2012 and which claims the benefit of U.S. Provisional Patent Application 61/436,619, filed Jan. 27, 2011, and U.S. Provisional Patent Application 61/486,341, filed May 16, 2011, whose disclosures are incorporated herein by reference.

TECHNICAL FIELD

Embodiments described herein relate generally to data storage, and particularly to methods and systems for programming verification in memory cells.

BACKGROUND

Various techniques are known in the art for verifying the success of programming operations in non-volatile memory devices, such as Flash memory. For example, U.S. Pat. No. 7,434,111, whose disclosure is incorporated herein by reference, describes a non-volatile memory comprising a non-volatile memory and a memory controller. The non-volatile memory has a pseudo pass function of returning a pass as a status even if a bit error reaching an allowable number of bits occurs after at least one of a write or erase sequence is completed. The memory controller has an allowable bit change function of changing the upper limit value of the allowable number of bits.

As another example, U.S. Pat. No. 5,469,444, whose disclosure is incorporated herein by reference, describes an electrically erasable and programmable non-volatile memory system with write-verify controller using two reference levels. An EEPROM includes an array of memory cell transistors, which is divided into cell blocks each including NAND cell units of series-connected cell transistors. A sense amplifier is connected to bit lines and a comparator. A data-latch circuit is connected to the comparator, for latching a write-data supplied from a data input buffer. The comparator compares the actual data read from one of the programmed cell transistors with the write-data, to verify its written state. The write-verify process checks the resulting threshold voltage for variations using first and second reference voltages defining the lower-limit and upper-limit of an allowable variation range.

As yet another example, U.S. Pat. No. 6,278,632, whose disclosure is incorporated herein by reference, describes a method for detecting an under-programming or over-programming condition in a multistate memory cell. The method uses three sense amplifiers, each with an associated reference cell that produces a reference voltage for input to each of the sense amplifiers. Control circuitry is used, which allows the reference cell currents to be varied to produce the reference voltages or pairs of reference voltages needed to accurately determine the threshold voltage and hence state of a programmed or erased memory cell. This information is used by a controller to determine if a memory cell has been over-programmed, under-programmed, or properly programmed.

SUMMARY

An embodiment that is described herein provides a method for data storage. The method includes receiving in a memory device data for storage in a group of memory cells. The data is stored in the group by performing a Program and Verify (P&V) process, which applies to the memory cells in the group a sequence of programming pulses and compares respective analog values of the memory cells in the group to respective verification thresholds. Immediately following successful completion of the P&V process, a mismatch between the stored data and the received data is detected in the memory device. An error in storage of the data is reported responsively to the mismatch.

In some embodiments, detecting the mismatch includes receiving in the memory device a command that includes a copy of the data and instructs the memory device to read the stored data, executing the command so as to reproduce the stored data, and detecting the mismatch between the stored data and the copy of the data received in the command. In an embodiment, receiving the data includes buffering the received data in the memory device until after the successful completion of the P&V process, and detecting the mismatch includes identifying the mismatch between the stored data and the buffered received data. Buffering the received data may include buffering a first copy of the received data in a first buffer for use in the P&V process, and buffering a second copy of the received data in a second buffer for comparison with the stored data following the completion of the P&V process.

In another embodiment, detecting the mismatch includes receiving in the memory device a command that instructs the memory device to read the stored data following the completion of the P&V process and specifies one or more read thresholds for reading the stored data, executing the command so as to reproduce the stored data, and detecting the mismatch between the reproduced stored data and the received data.

In yet another embodiment, reporting the error includes indicating the error only when a number of bits differing between the stored data and the received data exceeds a predefined threshold. In still another embodiment, reporting the error includes reporting a number of bits differing between the stored data and the received data. In an embodiment, detecting the mismatch includes comparing the stored data with the received data, comparing a part of the stored data with a corresponding part of the received data, or comparing a statistical measure of the stored data with a corresponding statistical measure of the received data.

There is additionally provided, in accordance with an embodiment, an apparatus for data storage including multiple memory cells and circuitry. The circuitry is configured to receive data for storage in a group of the memory cells, to store the data in the group by performing a Program and Verify (P&V) process, which applies to the memory cells in the group a sequence of programming pulses and compares respective analog values of the memory cells in the group to respective verification thresholds, to detect, immediately following successful completion of the P&V process, a mismatch between the stored data and the received data, and to report an error in storage of the data responsively to the mismatch.

There is also provided, in accordance with an embodiment, a method for data storage that includes storing data in a group of memory cells. After storing the data, a number is assessed of the memory cells in the group that are in an erased state. An error in storage of the data is reported upon detecting that the assessed number is below a predefined threshold. In some embodiments, reporting the error includes reporting an attempt to store a data page in the group even though the group is already programmed with the page.

There is further provided, in accordance with an embodiment, an apparatus for data storage including an interface for communicating with a memory including memory cells, and circuitry. The circuitry is configured to store data in a group of the memory cells, to assess, after storing the data, a number of the memory cells in the group that are in an erased state, and to report an error in storage of the data upon detecting that the assessed number is below a predefined threshold.

There is additionally provided, in accordance with an embodiment, a method for data storage in a memory device including memory cells. The method includes providing a definition of multiple programming states and corresponding verification thresholds. Data is stored in a group of the memory cells by performing a Program and Verify (P&V) process, which programs the memory cells in the group to respective intended programming states selected from among the programming states by applying to the memory cells in the group a sequence of programming pulses and comparing analog values of the memory cells in the group to the verification thresholds corresponding to the intended programming states. At least one memory cell in the group, which is programmed by the P&V process to an analog value that is above a first verification threshold that is higher than a second verification threshold corresponding to an intended programming state of the at least one memory cell, is identified. An error in storage of the data is reported responsively to the at least one identified memory cell.

There is also provided, in accordance with an embodiment, apparatus for data storage including multiple memory cells and circuitry. The circuitry is configured to provide a definition of multiple programming states and corresponding verification thresholds, to store data in a group of the memory cells by performing a Program and Verify (P&V) process, which programs the memory cells in the group to respective intended programming states selected from among the programming states by applying to the memory cells in the group a sequence of programming pulses and comparing analog values of the memory cells in the group to the verification thresholds corresponding to the intended programming states, to identify at least one memory cell in the group that is programmed by the P&V process to an analog value that is above a first verification threshold that is higher than a second verification threshold corresponding to an intended programming state of the at least one memory cell, and to report an error in storage of the data responsively to the at least one identified memory cell.

There is further provided, in accordance with an embodiment, a method for data storage. The method includes submitting write commands to a memory device for execution by the memory device. Respective durations of the execution of the write commands by the memory device are measured. A health status of a memory block in the memory device is assessed based on the durations of the write commands executed in the memory block.

In some embodiments, assessing the health status includes marking the memory block as bad when the durations of the write commands executed in the memory block deviate from a predefined range. In an embodiment, assessing the health status includes marking the memory block as subject to additional evaluation when the durations of the write commands executed in the memory block deviate from a predefined range.

In a disclosed embodiment, the write commands cause the memory device to store the data using a Program and Verify (P&V) process, which applies to memory cells in the block a sequence of programming pulses and compares respective analog values of the memory cells to respective verification thresholds, and assessing the health status includes, when the durations of the write commands executed in the memory block deviate from a predefined range, instructing the memory device to read the stored data following successful completion of the P&V process and check for programming errors not detected by the P&V process.

There is moreover provided, in accordance with an embodiment, an apparatus for data storage including an interface for communicating with a memory device including memory blocks, and circuitry. The circuitry is configured to submit write commands to the memory device for execution by the memory device, to measure respective durations of the execution of the write commands by the memory device, and to assess a health status of a memory block in the memory device based on the durations of the write commands executed in the memory block.

These embodiments will be more fully understood from the following detailed description, taken together with the drawings in which:

DETAILED DESCRIPTION OF EMBODIMENTS

Overview

Figure 1:
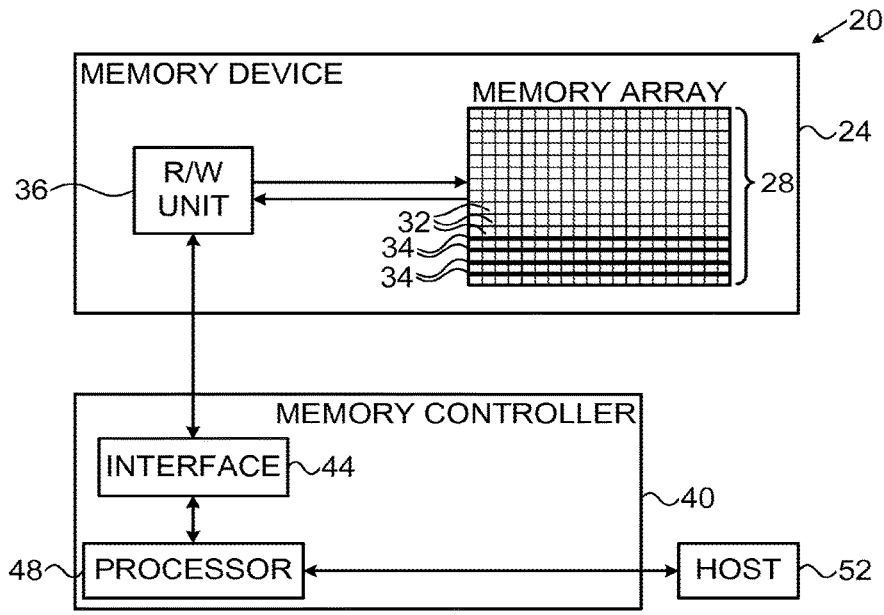
FIG. 1 is a block diagram that schematically illustrates a memory system, in accordance with an embodiment.

In memory devices such as Flash memory, data is typically stored in analog memory cells by programming the memory cells to respective analog values that represent the stored bit values. Each bit value corresponds to a respective programming level or programming state, which is represented by a certain region of analog values.

In some memory devices, a group of analog memory cells is programmed in an iterative Programming and Verification (P&V) process, which applies a sequence of programming pulses to the memory cells in the group. The analog values of the memory cells are verified during the sequence, by comparing each analog value to a respective verification threshold that corresponds to the intended programming state of the memory cell being programmed. Programming continues only for memory cells whose analog values are still below their respective verification thresholds. The other memory cells are assumed to be programmed correctly, and are inhibited from receiving subsequent programming pulses.

In practice, however, the P&V process may program a memory cell to an incorrect programming state, even though the analog value passes the respective verification threshold. For example, some memory cells may be more responsive to programming than others. The P&V process may program such a memory cell to a programming state that is higher than the intended programming state (i.e., corresponds to a higher range of analog values). Since the P&V process only verifies that the analog value is higher than the verification threshold, such a memory cell will typically be regarded as programmed correctly even though it is not.

As another example, if some failure occurs in the verification stage of the P&V process, memory cells may be assumed to be programmed correctly even though they did not reach the desired programming states. In other scenarios, memory cells may be programmed using P&V to incorrect programming states for various other reasons. This sort of erroneous programming is highly undesirable, because the memory device typically reports that programming is successful, and no corrective measures are taken to correct the programming errors.

Embodiments that are described hereinbelow provide improved methods and systems for verifying programming operations in analog memory cells. The disclosed embodiments can be useful in preventing the above-described scenarios in which the memory device reports that the P&V process completed successfully even though programming errors occurred.

In some disclosed embodiments, a memory controller sends to the memory device a write command, which causes the memory device to program a group of memory cells with data using P&V. After the P&V process completes successfully, the memory controller sends to the memory device a read-after-write command that instructs the memory device to read the data from the group of memory cells. The read-after-write command also provides the memory device with expected data, i.e., a copy of the data that was sent for programming in the first place. In response to this command, the memory device reads the data from the group of memory cells, compares the read data with the expected data, and reports a programming error if a mismatch is found.

In alternative embodiments, upon receiving a write command from the memory controller, the memory device stores the data to be programmed in a dedicated buffer that is not modified during the P&V process. Immediately after completing the P&V process, the memory device reads the programmed data from the group of memory cells, compares the read data with the data stored in the buffer, and reports a programming error in case of a mismatch.

In other embodiments, following P&V, the memory device or the memory controller assesses the number of memory cells whose analog values passed the verification threshold of a programming state that is higher than the intended programming state. If the number of such memory cells exceeds a certain threshold, programming is reported erroneous.

Other disclosed embodiments provide schemes for detecting double programming, i.e., detecting an event in which the memory device mistakenly programs a page that is already programmed. A second page programming attempt programs a certain portion of the memory cells from an erased state to a higher programming state. An exceedingly small number of erased memory cells can therefore be used as an indication of double programming. In some embodiments, the memory device or the memory controller assesses the number of erased memory cells in the group. If the number of erased memory cells is smaller than a certain threshold, the group of memory cells is reported double-programmed.

In some embodiments, the memory device or the memory controller measures the programming times of write commands, and use the programming times as an indication as to the health level of the memory cells. For example, if programming times of write commands in a certain memory block deviate from a certain permitted range, the block may be marked as bad even though P&V programming in the block may be successful.

The disclosed techniques identify programming errors that are undetected by the P&V process that stores data in the memory cells. In some embodiments the disclosed techniques are implemented in the memory controller, in which case the memory controller may accept an indication of successful programming from the memory device but report a programming error to the host.

System Description

FIG. 1 is a block diagram that schematically illustrates a memory system 20, in accordance with an embodiment. System 20 can be used in various host systems and devices, such as in computing devices, cellular phones or other communication terminals, removable memory modules (sometimes referred to as "Flash drives"), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 28 that are arranged in word lines 34. In the context of the present patent application and in the claims, the term "analog memory cell" is used to describe any memory cell that holds a continuous, analog value of a physical parameter, such as an electrical voltage or charge. Array 32 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of analog values.

System 20 stores data in the analog memory cells by programming the cells to assume respective memory states, which are also referred to as programming states or programming levels. The programming states are selected from a finite set of possible states, and each programming state corresponds to a certain nominal storage value. For example, a 2 bit/cell MLC can be programmed to assume one of four possible programming states by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, erased memory cells are set to an erased level that occupies a range of negative analog values, and the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, and a processor 48. The disclosed techniques can be carried out by memory controller 40, by R/W unit 36, or both. Thus, in the present context, memory controller 40 and R/W unit 36 are referred to collectively as circuitry that carries out the disclosed techniques.

Memory controller 40 communicates with a host 52, for accepting data for storage in the memory device and for outputting data retrieved from the memory device. Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the embodiments included herein, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines 34, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, memory controller 40 sends to memory device 24 write commands for storing data in memory cells 32. In response to a write command, R/W unit programs a page of data into a selected group of memory cells in a certain word line 34, using an iterative Program & Verify (P&V) process. The P&V process applies a sequence of programming pulses to the memory cells in the group.

During the programming sequence, unit 36 verifies the analog values (in the present example the threshold voltages) of the memory cells, by comparing each threshold voltage to a respective verification threshold that corresponds to the intended programming state of the memory cell being programmed. When the threshold voltage of a given memory cell exceeds the respective verification threshold, unit 36 inhibits the memory cell from receiving subsequent programming pulses. Programming continues only for memory cells whose threshold voltages are still below their respective verification thresholds.

In some cases, however, the P&V process may program a memory cell to an incorrect programming state even though the threshold voltage of the memory cell exceeds the respective verification threshold. The reason for such programming errors is, for example, that the P&V process does not verify that the cell threshold voltage is within the range corresponding to the intended programming state, but only that the cell threshold voltage is above the verification threshold of that programming state.

Therefore, if the P&V process programs a memory cell to a threshold voltage that is above the range defined for the intended programming state, the memory cell will be programmed incorrectly but the P&V process will not detect the error. As a result, the memory device may report that the write command was successful even though it was not. Such an event is highly undesirable because the memory controller is unaware of the fact that programming has failed, and cannot take measures to correct the error. In some embodiments, system 20 identifies programming errors that are undetected by the P&V process, and is therefore able to correct the errors.

Programming Verification Using Read-after-Write Command

Figure 2:
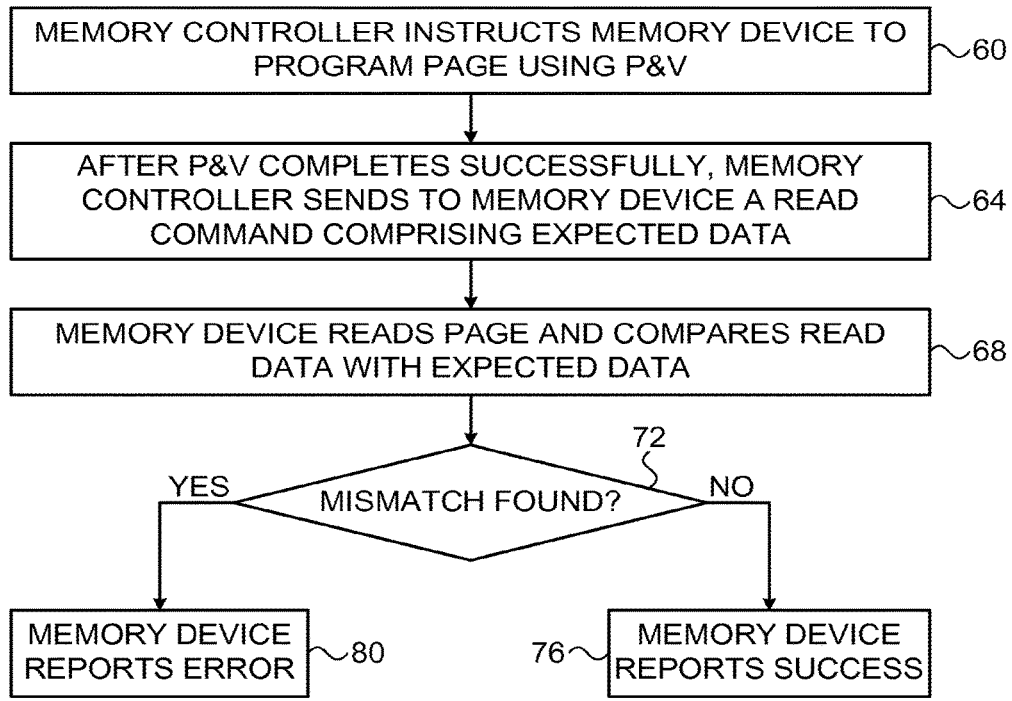
FIGS. 2-5 are flow charts that schematically illustrate methods for programming verification, in accordance with various embodiments.

FIG. 2 is a flow chart that schematically illustrates a method for programming verification, in accordance with an embodiment. The method begins with memory controller 40 sending to memory device 24 a write command, at a programming step 60. The memory controller typically initiates the write command in response to a request from host 52 to read certain data. The write command instructs the memory device to program a group of memory cells with a page of data using P&V. R/W unit 36 in the memory device executes the requested write command.

Immediately after the P&V process completes successfully, memory controller 40 sends to memory device 24 a read-after-write command, at a read-after-write step 64. The read-after-write command instructs the memory device to read back the data from the group of memory cells that was just programmed. In addition to the address to be read, the read-after-write command also provides the memory device with a copy of the data that is expected to be read, i.e., with the data that the memory controller sent for programming at step 60 above.

In response to the read-after-write command, R/W unit 36 reads the data from the group of memory cells, and compares the read data with the expected data, at a readout and comparison step 68. The R/W unit checks for mismatch between the read data and the expected data, at a mismatch checking step 72. If no mismatch is found, memory device 24 reports that the write command was completed successfully, at a success reporting step 76. Otherwise, the memory device reports that the write command has failed, at a failure reporting step 80. The memory controller may convey the success or failure indication to host 52.

In some embodiments, the memory controller includes in the read-after-write command the read thresholds that are to be used in reading the memory cells. In these embodiments, R/W unit 36 reads the memory cells at step 68 using the read thresholds specified in the read-after-write command. Alternatively, unit 36 performs the readout at step 68 using some default read thresholds or using any other suitable read thresholds.

In various embodiments, the mismatch between the read data and the expected data may be defined in different ways. In some embodiments, system 20 may require a perfect match, i.e., zero programming errors, in order to declare a successful write command. In other embodiments, system 20 may tolerate up to a certain number of programming errors per page. For example, when each page is encoded with an Error Correction Code (ECC), the memory controller is able to decode a page successfully even in the presence of some programming errors.

In some embodiments, the memory device may report the number of programming errors found in the page (the number of bits that differ between the read data and the expected data) to the memory controller, either instead of or in addition to reporting success or failure.

R/W unit 36 in the memory device may compare the read data with the expected data at step 68 in various ways. For example, unit 36 may compare only part of the data page, e.g., half of the page (and the memory controller may therefore send only part of the page as expected data and thus reduce communication overhead).

In an alternative embodiment, unit 36 may compute a statistical measure of the read data, and compare it with a corresponding statistical measure of the expected data. Examples of statistical measures may comprise the width (e.g., variance) of the histogram of programming states, or the numbers of memory cells that are programmed to the various programming states. In some embodiments, the statistical measure of the expected data is computed by the memory device. In alternative embodiments, the statistical measure of the expected data is computed by the memory controller and provided to the memory device. The latter implementation is efficient in terms of communication overhead between the memory controller and the memory device.

Programming Verification Using Dual Page Buffers in Memory Device

Figure 3:
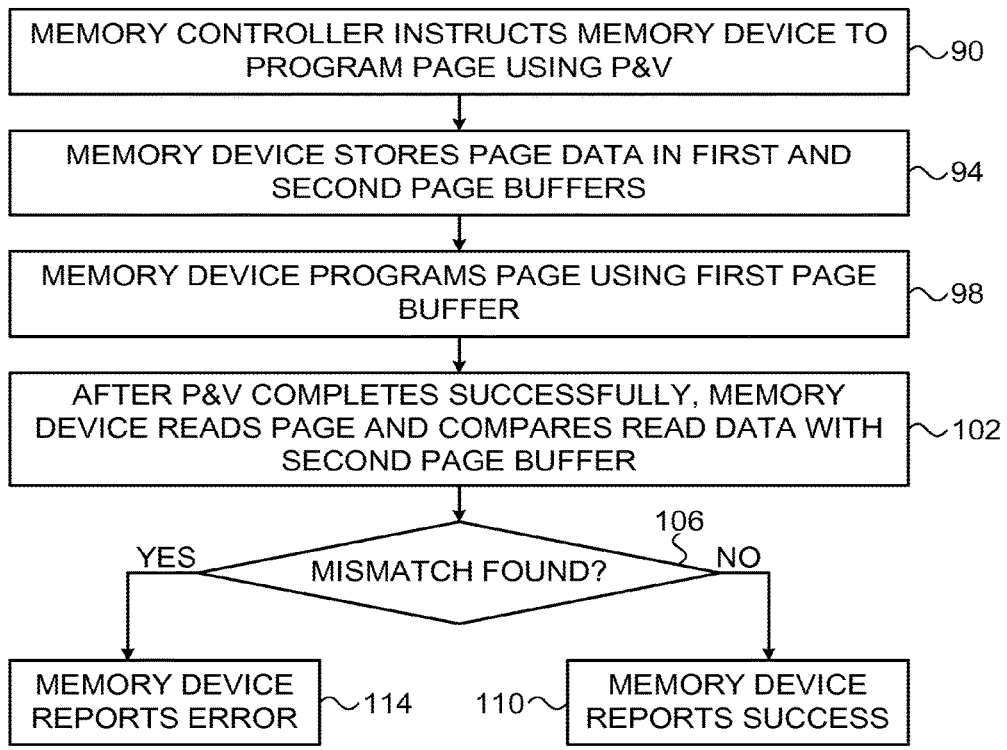

FIG. 3 is a flow chart that schematically illustrates a method for programming verification, in accordance with an alternative embodiment. The method begins with memory controller 40 sending to memory device 24 a write command, at a writing step 90. The memory controller typically initiates the write command in response to a request from host 52 to read certain data. The write command instructs the memory device to program a group of memory cells with a page of data using P&V. R/W unit 36 in the memory device executes the write command.

R/W unit 36 in the memory device stores two replicas of the data of the page, in first and second page buffers, at a buffering step 94. The first page buffer is used for the P&V process, while the second page buffer is used for verification immediately following completion of the P&V process. (Generally, the second page buffer may hold any suitable information from which the page data is recoverable. Storing such information is regarded as a way of storing the page data.)

Unit 36 programs the page into the group of memory cells using P&V, at a storage step 98. The P&V process uses the first replica of the page data that is stored in the first page buffer. During the P&V process in this example, R/W unit 36 uses the first page buffer to mark which memory cells are inhibited from receiving programming pulses and which memory cells are to continue programming. At the end of the P&V process, the first page buffer no longer contains the page data, and therefore cannot be used for verification. For this reason, R/W unit 36 performs the verification using the second replica of the page data that is stored in the second page buffer.

Immediately after the P&V process completes successfully, the R/W unit reads the page from the group of memory cells and compares the read data with the content of the second page buffer, at a verification step 102. The R/W unit checks for mismatch between the read data and the data in the second page buffer, at a checking step 106. If no mismatch is found, memory device reports that the write command was completed successfully, at a success notification step 110. Otherwise, the memory device reports that the write command has failed, at a failure notification step 114. The memory controller may convey the success or failure notification to host 52.

As explained above with respect to the method of FIG. 2, system 20 may define mismatch in various ways, e.g., require zero programming errors or alternatively tolerate up to a certain number of programming errors. As explained above with respect to the method of FIG. 2, system 20 may compare the read data with the data of the second page buffer in various ways, such as compare only part of the data or compare statistical measures of the data. The memory device may report the number of programming errors found in the page.

In some embodiments, the write command at step 90 comprises a special write command that instructs the memory device to perform readout and comparison (step 102) following the P&V process. The special write command may be defined in addition to a conventional write command that does not involve readout and comparison. In an embodiment, the special write command also specifies the read thresholds to be used for the readout at step 102. Alternatively, unit 36 performs the readout at step 102 using some default read thresholds or using any other suitable read thresholds.

In comparison with the method of FIG. 2, the method of FIG. 3 sends the page data from the memory controller to the memory device only once. This feature reduces communication overhead between the memory controller and the memory device. Moreover, when using the method of FIG. 3, if the write operation fails (step 114) the page data is still available in the second page buffer. In some embodiments, the memory controller may re-attempt the write command (possibly to a different group of memory cells) without having to resend the data to the memory device.

Programming Verification for Preventing Double Programming

In some practical cases, R/W unit 36 may mistakenly attempt to program a page that is already programmed. In a Single-Level Cell (SLC) device, for example, the R/W unit may attempt to program a group of memory cells that is already programmed. In a Multi-Level Cell (MLC) device, each group of memory cells holds two or more pages—One page in the Least Significant Bits (LSB) of the memory cells and another page in the Most Significant Bits (MSB) of the memory cells. Unit 36 may attempt to program the LSB page in a group of memory cells in which the LSB page is already programmed (either before or after the MSB page is programmed).

For randomized (e.g., scrambled) data, approximately 50% of the memory cells are at the erased level following LSB programming. If another LSB programming is performed mistakenly in a group of cells that is already LSB-programmed, the number of memory cells at the erased level will be reduced considerably (e.g., to approximately 25% if the second LSB data is also randomized). If the group of memory cells is already programmed with both LSB and MSB pages when the second LSB programming is attempted, the number of memory cells at the erased level is reduced even further.

In some embodiments, memory device 24 or memory controller 40 identifies double programming events by checking the number of memory cells that are at the erased level, for example by performing a read operation with a read threshold set at or near zero volts. The memory device or memory controller compares the number of erased cells to an upper threshold, and report double programming (and thus programming failure) if the number of erased memory cells is below the upper threshold.

The upper threshold is typically set to a value that is lower than 50% by a suitable margin that allows for statistical variations, actual memory device impairments, erase penetration and/or other factors. Double programming failure is typically regarded as a logical failure and not as a device failure. In other words, when the block containing this group of memory cells will be erased, the memory cells will typically be fully functional for storage.

Figure 4:
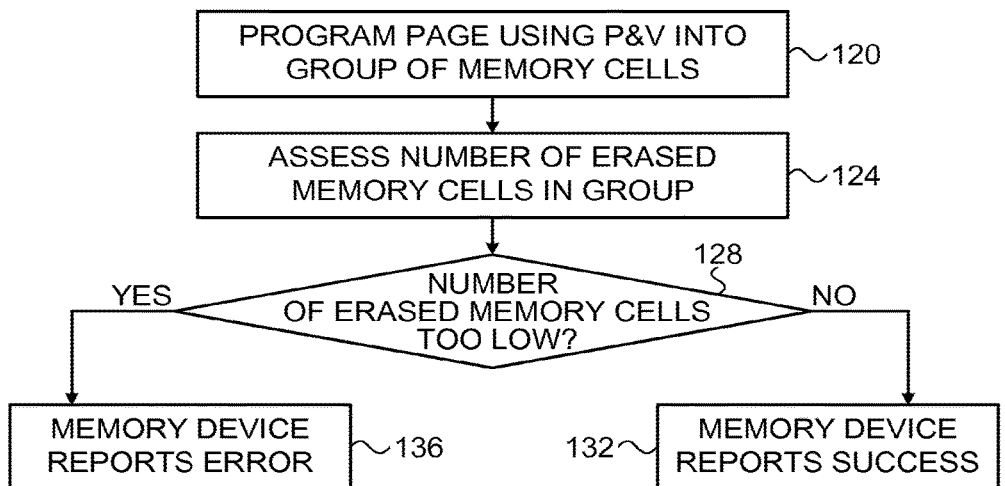

FIG. 4 is a flow chart that schematically illustrates a programming verification method for preventing double programming, in accordance with another embodiment. The method begins with memory controller 40 and memory device 24 programming an LSB page in a group of memory cells, at an LSB programming step 120. The memory controller or the memory device assesses the number of memory cells that are at the erased level, at an erased cell assessment step 124.

The memory controller or the memory device checks whether the number of memory cells is below a predefined threshold, at an erased cell checking step 128. If not, the LSB programming operation of step 120 is reported as successful. Otherwise, the LSB programming operation of step 120 is reported as a programming failure.

The example above referred mainly to detecting double LSB programming. The disclosed technique, however, can be used for detecting double programming of any other page type. Alternatively to assessing the number of erased cells, the disclosed techniques can be implemented by assessing the number of memory cells that are set to any other suitable programming state or states.

The method above may not be usable for detecting double LSB programming if the MSB page is already programmed, since in this case the number of erased cells will be on the order of 25% even following correct programming. The memory device, however, can typically identify whether or not the MSB page is programmed. In some embodiments, the memory controller or memory device applies the method of FIG. 4 only if the memory device indicates that the MSB page is not programmed. If the MSB page is programmed, programming error may be declared without statistical evaluation of the erased cells.

Programming Verification by Detecting Threshold Voltages Exceeding Verification Threshold of Higher Programming States As explained above, each programming state of memory device 24 corresponds to a respective verification threshold. The P&V process regards any memory cell, whose threshold voltage exceeds the verification threshold of the intended programming state of the memory cell, as programmed successfully.

In some embodiments, R/W unit 36 detects programming errors by comparing the threshold voltage of a given memory cell not only to the verification threshold of the intended programming state of the cell, but also to the verification threshold of a higher programming state. The term "higher programming state" refers to any programming state that corresponds to a threshold voltage range that is above the threshold voltage range of the intended programming state.

This additional comparison enables the R/W unit to identify memory whose threshold voltages are exceedingly high and do not correspond to the intended programming states of the cells. These scenarios are not detected by the P&V process. R/W unit 36 may perform the additional comparison at any suitable time, e.g., at a predefined point during the P&V process, following each programming pulse of the P&V process or after the P&V process is completed.

Figure 5:
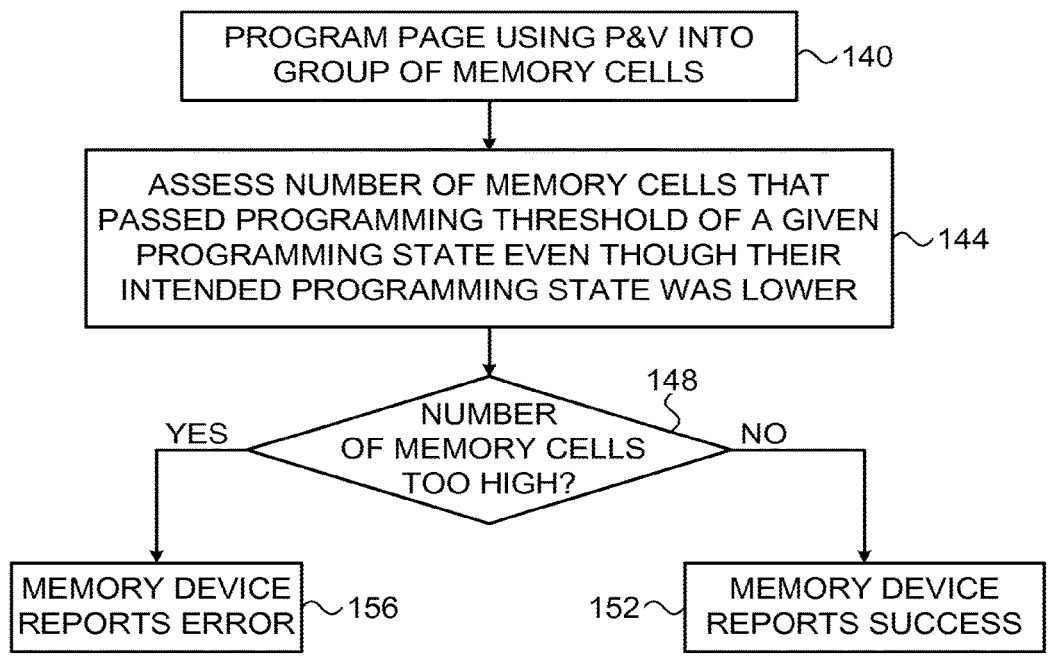

FIG. 5 is a flow chart that schematically illustrates a method for programming verification, in accordance with an embodiment. The method begins with R/W unit 36 of memory device 24 programming a page into a group of memory cells using P&V, at a P&V step 140. During or after the P&V process, the R/W unit assesses the number of memory cells whose threshold voltages are above the verification threshold of a programming state that is higher than the intended programming state, at a high programming detection step 144.

The R/W unit checks whether the number of such memory cells is above a certain threshold, at a high programming checking step 148. If not, the R/W unit reports programming success, at a success step 152. Otherwise, the R/W unit reports programming failure, at a failure step 156.

Block Health Assessment Based on Programming Time

In some embodiments, memory controller 40 measures the programming time of different groups of memory cells, e.g., the durations of write commands to different addresses. Programming time that deviates from a predefined range (below a certain lower threshold and/or above a certain upper threshold) may indicate that the memory cells are in poor health and may be unreliable or fail shortly.

In some embodiments, the memory controller marks a given memory block as bad or as suspicious if programming times of write commands to the block deviate from the predefined range. A bad block is typically taken out of service. A suspicious block is typically subjected to additional evaluation before marking it as bad. The memory controller may mark the block as bad or suspicious based on the average programming time for the block, the maximum or minimum programming time for the block, or any other suitable measure of programming time associated with the block.

In some embodiments, the memory controller marks a block as bad based on the programming time criterion, even though P&V processes in the block complete successfully. In some embodiments, the memory controller applies a verification technique following P&V, such as any of the techniques of FIGS. 2-5 above, only for blocks in which the programming time deviates from the predefined range.

In one example embodiment, a tolerable range of LSB programming time is between 400-700 µS, and a tolerable range of MSB programming time is between 1.8-2.2 mS for even-order pages and between 1.5-2 mS for odd-order pages. A deviation from the tolerable range may be defined as some percentage from the average programming time of the block (which can be calculated in real time during memory device operation) or from the average programming time of the memory device or die. Alternatively, any other suitable ranges or criteria can be used.

Figure 6:
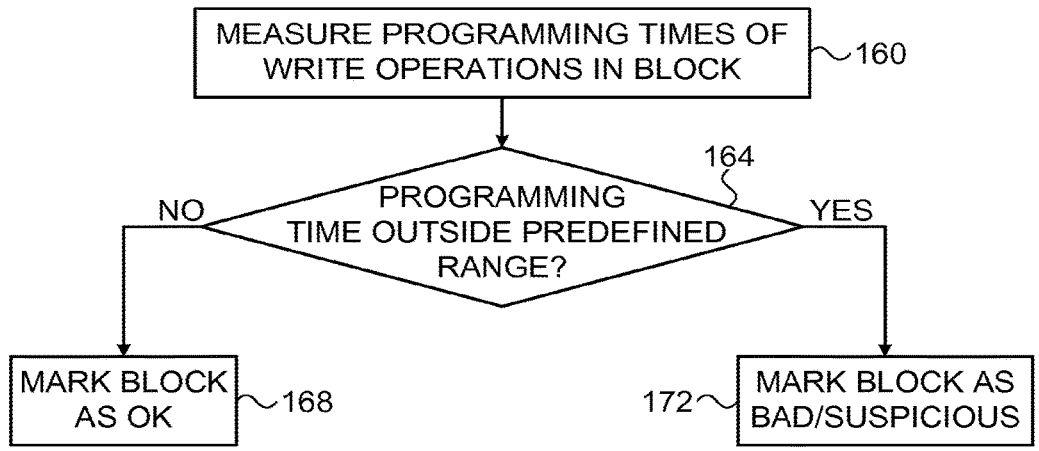
FIG. 6 is a flow chart that schematically illustrates a method for assessing the health level of memory blocks, in accordance with an embodiment.

FIG. 6 is a flow chart that schematically illustrates a method for assessing the health level of memory blocks, in accordance with an embodiment. The method begins with memory controller 40 measuring the programming times of write commands applied to a certain memory block, at a programming time measurement step 160. The memory controller checks whether the programming time deviates from the predefined range, at a range checking step 164. If not, the memory controller regards the block as functional, at a functional marking step 168. Otherwise, the memory controller marks the block as bad or suspicious, at a bad/suspicious marking step 172.

It will be appreciated that the embodiments described above are cited by way of example, and that the appended claims are not limited to what has been particularly shown and described hereinabove. Rather, the scope of the claims may include both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a plurality of blocks, wherein each block of the plurality of blocks includes a plurality of data storage cells;
circuitry configured to:
measure respective durations of one or more write commands associated with storing data in one or more data storage cells of the plurality of data storage cells in a particular block of the plurality of blocks;
compare the respective durations of the one or more write commands to a predefined duration range; and
identify the particular block as bad in response to a determination that the respective durations of the one or more write commands deviate from the predefined duration range.

2. The apparatus of claim 1, wherein to compare the respective durations of the one or more write commands to the predefined duration range, the circuitry is further configured to calculate an average duration dependent upon the respective durations of the one or more write commands.

3. The apparatus of claim 1, wherein to compare the respective durations of the one or more write commands to the predefined duration range, the circuitry is further configured to determine a maximum duration using the respective durations of the one or more write commands.

4. The apparatus of claim 1, wherein to compare the respective durations of the one or more write commands to the predefined duration range, the circuitry is further configured to determine a minimum duration the respective durations of the one or more write commands.

5. The apparatus of claim 1, wherein the circuitry is further configured to remove the particular block from service in response to identifying the particular block as bad.

6. The apparatus of claim 1, wherein the circuitry is further configured to perform additional evaluation of the particular block in response to identifying the particular block as bad.

7. A method, comprising:
measuring respective durations of one or more write commands associated with storing data in one or more data storage cells of a plurality of data storage cells included in a particular block of a plurality of blocks;
comparing the respective durations of the one or more write commands to a predefined duration range; and
identifying the particular block as bad in response to determining that the respective durations of the one or more write commands deviate from the predefined duration range.

8. The method of claim 7, wherein comparing the respective durations of the one or more write commands to the predefined duration range includes calculating an average duration using the respective durations of the one or more write commands.

9. The method of claim 7, wherein comparing the respective durations of the one or more write commands to the predefined duration range includes calculating a maximum duration of the respective durations of the one or more write commands.

10. The method of claim 7, wherein comparing the respective durations of the one or more write commands to the predefined duration range includes calculating a minimum duration using the respective durations of the one or more write commands.

11. The method of claim 7, further comprising removing the particular block from service in response to identifying the particular block as bad.

12. The method of claim 7, further comprising performing an additional evaluation of the particular block in response to identifying the particular block as bad.

13. The method of claim 7, further comprising comparing data read from at least one data storage cell of the plurality of data storage cells included in the particular block to expected data in response to determining that the respective durations of the one or more write commands deviate from the predefined duration range.

14. A system, comprising:
   a memory device including a plurality of blocks, wherein each block includes a plurality of data storage cells; and
   a controller coupled to the memory device, wherein the controller is configured to:
      measure respective durations of one or more write commands associated with storing data in one or more data storage cells of the plurality of data storage cells in a particular block of the plurality of blocks;
      compare the respective durations of the one or more write commands to a predefined duration range; and
      identify the particular block as bad in response to a determination that the respective durations of the one or more write commands deviate from the predefined duration range.

15. The system of claim 14, wherein to compare the respective durations of the one or more write commands to the predefined duration range, the controller is further configured to calculate an average duration dependent upon the respective durations of the one or more write commands.

16. The system of claim 14, wherein to compare the respective durations of the one or more write commands to the predefined duration range, the controller is further configured to determine a maximum duration dependent upon the respective durations of the one or more write commands.

17. The system of claim 14, wherein to compare the respective durations of the one or more write operations to the predefined duration range, the controller is further configured to determine a minimum duration dependent upon the respective durations of the one or more write commands.

18. The system of claim 14, wherein the controller is further configured to remove the particular block from service in response to identifying the particular block as bad.

19. The system of claim 14, wherein the controller is further configured to perform additional evaluation of the particular block in response to identifying the particular block as bad.

20. The system of claim 14, wherein the controller is further configured to compare data read from at least one data storage cell of the plurality of data storage cells included in the particular block to expected data in response to the determination that the respective durations of the one or more write commands deviate from the predefined duration range.

* * * * *